United States Patent
Ngo et al.

(10) Patent No.: US 6,900,121 B1
(45) Date of Patent: May 31, 2005

(54) LASER THERMAL ANNEALING TO ELIMINATE OXIDE VOIDING

(75) Inventors: Minh Van Ngo, Fremont, CA (US); Arvind Halliyal, Cupertino, CA (US); Dawn Hopper, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/097,015

(22) Filed: Mar. 14, 2002

(51) Int. Cl.[7] .......................................... H01L 21/4763
(52) U.S. Cl. ...................... 438/632; 438/438; 438/646; 438/795
(58) Field of Search ................... 438/795, 760, 438/787, 283, 263, 264, 265, 428, 438, 632, 646

(56) References Cited

U.S. PATENT DOCUMENTS

| | | | | |
|---|---|---|---|---|
| 4,284,659 A | * | 8/1981 | Jaccodine et al. | .......... 438/618 |
| 4,431,900 A | * | 2/1984 | Delfino et al. | .............. 438/760 |
| 4,439,245 A | * | 3/1984 | Wu | ................................ 117/8 |
| 5,935,763 A | * | 8/1999 | Caterer et al. | .............. 430/313 |
| 6,040,238 A | * | 3/2000 | Yang et al. | .................. 438/592 |
| 6,372,561 B1 | * | 4/2002 | Yu | .............................. 438/162 |
| 6,376,868 B1 | * | 4/2002 | Rhodes | ........................ 257/215 |
| 6,559,015 B1 | * | 5/2003 | Yu | .............................. 438/301 |
| 6,703,321 B2 | * | 3/2004 | Geiger et al. | ............... 438/760 |

FOREIGN PATENT DOCUMENTS

JP          2001-85545 A  *  9/1999  ....... H01L/21/8247

OTHER PUBLICATIONS

Wolf, "Silicon Processing for the VLSI Era", vol. 2, pp. 206–207.*

Tissier et al., "A Non–Destructive Method for In–Line Glass Flow Control", VLSI Multilevel Interconnection Conference, 1988, Porceedings., Fifth Internation IEEE, Jun. 13, 1988–Jun. 14, 1988, pp. 374–391.*

* cited by examiner

Primary Examiner—Asok Kumar Sarkar

(57) ABSTRACT

Oxide voiding is eliminated was substantially reduced by laser thermal annealing. Embodiments include fabricating flash memory devices by depositing a BPSG over spaced apart transistors as the first interlayer dielectric with voids formed in gaps between the transistors and laser thermal annealing the BPSG layer in flowing nitrogen to eliminate or substantially reduce the voids by reflowing the BPSG layer.

18 Claims, 4 Drawing Sheets

LASER THERMAL ANNEALING TO ELIMINATE OXIDE VOIDING

FIELD OF THE INVENTION

The present invention relates to a method of manufacturing semiconductor devices having high reliability. The present invention has particular applicability in manufacturing high density, multi-level semiconductor devices with feature dimensions in the deep sub-micron regime.

BACKGROUND ART

Various issues arise in attempting to satisfy the ever increasing demands for miniaturization, particularly in fabricating non-volatile semiconductor devices, such as flash memory devices, e.g., electrically erasable programmable read only memory (EEPROM) devices. The demands for continuing miniaturization have led to the fabrication of flash memory devices comprising transistors having a gate width of about 0.13 micron and under a gap between gate structures spaced apart by about 0.33 micron or less. In accordance with conventional practices, an oxide sidewall spacer is formed on side surfaces of the gate stack and a conformal silicon nitride layer, serving as an etch stop layer, is deposited over the gate structures including the sidewall spacers, thereby further reducing the gap between gate structures to about 0.15 micron or less. In accordance with conventional practices, a first interlayer dielectric ($ILD_0$) is deposited over the gate structures and fills the gaps therebetween. Such an oxide layer is typically a boron-phosphorus-doped silicate glass (BPSG), typically containing about 4.3 at. % boron and about 5 at. % phosphorus. Rapid thermal annealing is then conducted, as at a temperature of about 820° C. for about 120 seconds.

As the distance between sidewall spacers of neighboring gate structures (gap), after depositing the etch stop layer, decreases to below about 0.125 micron, it becomes extremely difficult to fill the gaps with a gap fill oxide, such as a BPSG layer, even after post deposition rapid thermal annealing, without void formation. Such voiding in $ILD_0$ can lead to an open contact and shorting between contacts, thereby causing leakage and low production yields. A solution to this problem attendant upon conventional practices has not been forthcoming. For example, adverting to FIG. 1, a conventional device is schematically illustrated comprising transistors formed on substrate 30, which transistors comprising dual gate structures with an inter-poly (ONO) dielectric therebetween. The transistors typically comprise tunnel oxide 33, floating gate electrode 34, ONO stack inter-poly dielectric 35, and a control gate 36. A layer of metal silicide 37A is formed on an upper surface of the gate electrode stack while a layer of metal silicide 37B is formed on the source/drain regions 31, 32. A dielectric sidewall spacer 38, such as an oxide spacer, is formed on the side surfaces of the gate electrode and conformal silicon nitride etch stop layer 39 is deposited. The narrow gap between the gate structures after depositing the silicon nitride layer is typically no greater than about 0.125 micron. An oxide $ILD_0$ 300 is then deposited, such as a BPSG layer, and rapid thermal annealing is conducted. The resulting structure is characterized by voids 301 formed in the narrow gap between the gate stacks.

Accordingly, there exists a need for methodology enabling the fabrication of semiconductor devices, particularly flash memory devices, such as EEPROMs, with improved reliability. There exists a particular need for methodology enabling the fabrication of flash memory devices, such EEPROMs, with no or significantly reduced voids in the $ILD_0$ filling gaps between neighboring transistors.

DISCLOSURE OF THE INVENTION

An advantage of the present invention is a method of manufacturing a semiconductor device exhibiting improved reliability.

Another advantage of the present invention is a method of manufacturing a flash memory semiconductor device with improved reliability.

A further advantage of the present invention is a method of manufacturing a flash memory device with reduced voidings in the $ILD_0$ between closely spaced apart transistors.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising depositing an oxide layer over two gate electrode structures filling a gap therebetween, wherein the oxide layer contains a void in the gap; and laser thermal annealing the oxide layer to eliminate or substantially reduce the void by melting and reflowing the oxide layer.

Embodiments including forming flash memory gate stacks with a gap spaced apart by distance of about 0.33 micron or less, depositing a BPSG layer thereover filling the gap and, optionally, rapid thermal annealing, resulting in a void in the gap. Laser thermal annealing is then conducted by impinging a pulsed laser light beam on the BPSG layer, particularly directed toward the gap, at a radiant fluence of about 0.222 to about 0.228 joules/$cm^2$ for about 10 to about 100 nanoseconds in nitrogen flowing at a flow rate of about 200 to about 2000 sccm, thereby elevating the temperature of the BPSG layer to about 780° C. to about 840° C., causing melting and reflowing the BPSG layer to eliminate or substantially reduce the void.

Additional advantages of the present invention will become readily apparent to those skilled in this art from the following detailed description wherein embodiments of the present invention are described simply by way of illustrated of the best mode contemplated for carrying out the present invention. As will be realized, the present invention is capable of other and different embodiments, and its several details are capable of modifications in various obvious repeats, all without departing from the present invention. Accordingly, the drawings and description are to be regarded as illustrative in nature, and not as restrictive.

BRIEF DESCRIPTION OF THE DRAWINGS

In FIGS. 1 through 4, similar features or elements are denoted by similar reference characters.

DESCRIPTION OF INVENTION

The present invention addresses and solves various reliability problems attendant upon conventional semiconductor device fabrication techniques. The present invention provides efficient methodology enabling the fabrication of semiconductor devices exhibiting greater reliability. The present invention particularly addresses and solve, the oxide voiding problem typically encountered in implementing conventional practices to fabricate flash memory devices, such as EEPROM devices, when depositing the $ILD_0$, typically a BPSG layer, whereby voids are formed in the gap between closely spaced apart gate structures after rapid thermal annealing. In accordance with embodiments of the present invention, laser thermal annealing is implemented, either in lieu of or subsequent to conventional rapid thermal annealing, by impinging a pulsed laser light beam on the deposited oxide layer, particularly directed toward the gap between spaced apart gate structures, thereby causing reflowing of the oxide layer, such as a BPSG layer, to eliminate or substantially reduce the voids. Such laser thermal annealing can be implemented by impinging a pulsed laser light beam at the BPSG layer at a radiant fluence of about 0.222 to about 0.228 joules/cm$^2$ for about 10 to about 100 nanoseconds in nitrogen flowing at a flow rate of about 200 to about 2000 sccm, thereby elevating the temperature of the BPSG layer to about 780° C. to about 840° C.

Laser thermal annealing in accordance with the embodiments of the present invention effectively eliminates or reduces voiding in the $ILD_0$ in gaps between closely spaced apart gate structures, particularly wherein the gaps are about 0.125-micron or less (after forming sidewall spacers and depositing a conformal silicon nitride etch stop layer). Advantageously, laser thermal annealing enables pinpoint accuracy in targeting the region of the $ILD_0$, thereby avoiding unnecessarily elevating the temperature of other portions of the wafer causing various problems, such as undo dopant impurity diffusion. In addition, the use of laser thermal annealing only exposes the $ILD_0$ to an elevated temperature for only a brief period of time.

In implementing embodiments of the present invention, any of various commercially available laser tools may be employed, such as those utilizing a laser source capable of operating energies of about 10 to about 2000 mJ/cm$^2$/pulse, e.g., about 100 to about 400 mJ/cm$^2$/pulse. Commercially available tools exist which can perform such laser thermal annealing, either with or without a mask. The Verdant Technologies laser anneal tool is but an example and operates at an exposure wavelength of 308 nm.

Figure 1:
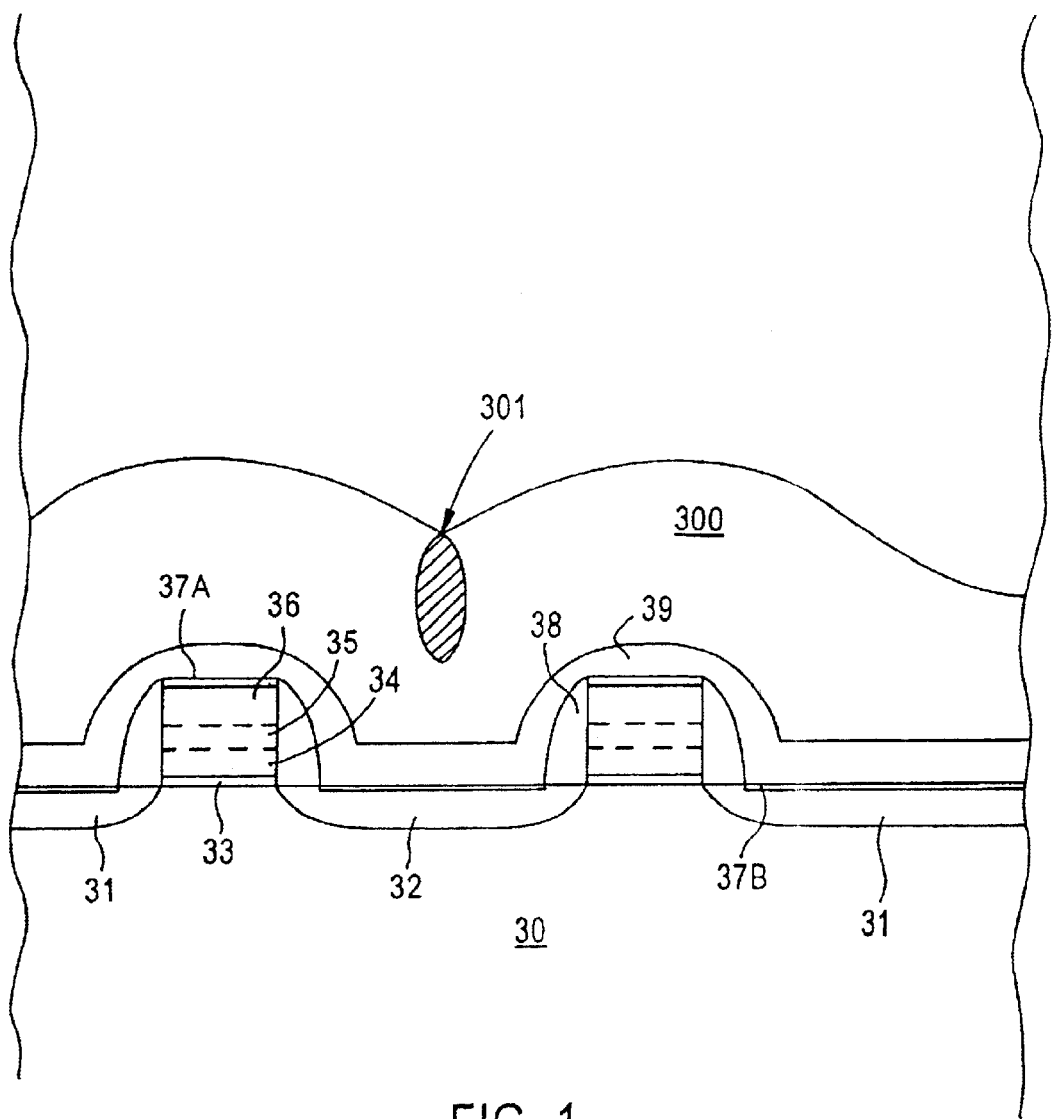
FIG. 1 schematically illustrates an $ILD_0$ voiding problems addressed and solved by the present invention.
Figure 2:
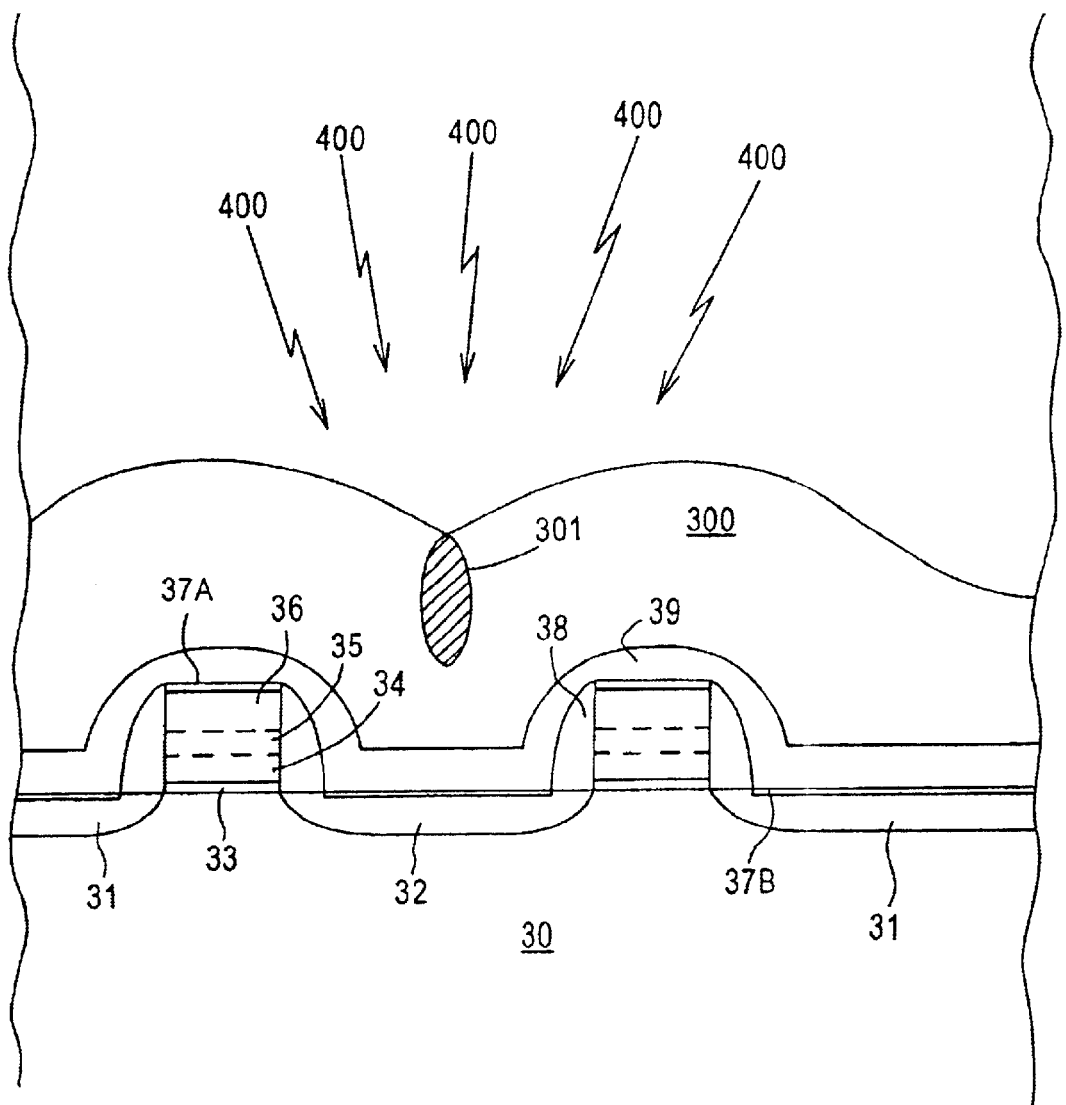
FIGS. 2 through 4 as schematically illustrate sequential phases of a method in accordance with an embodiment of the present invention.
Figure 3:
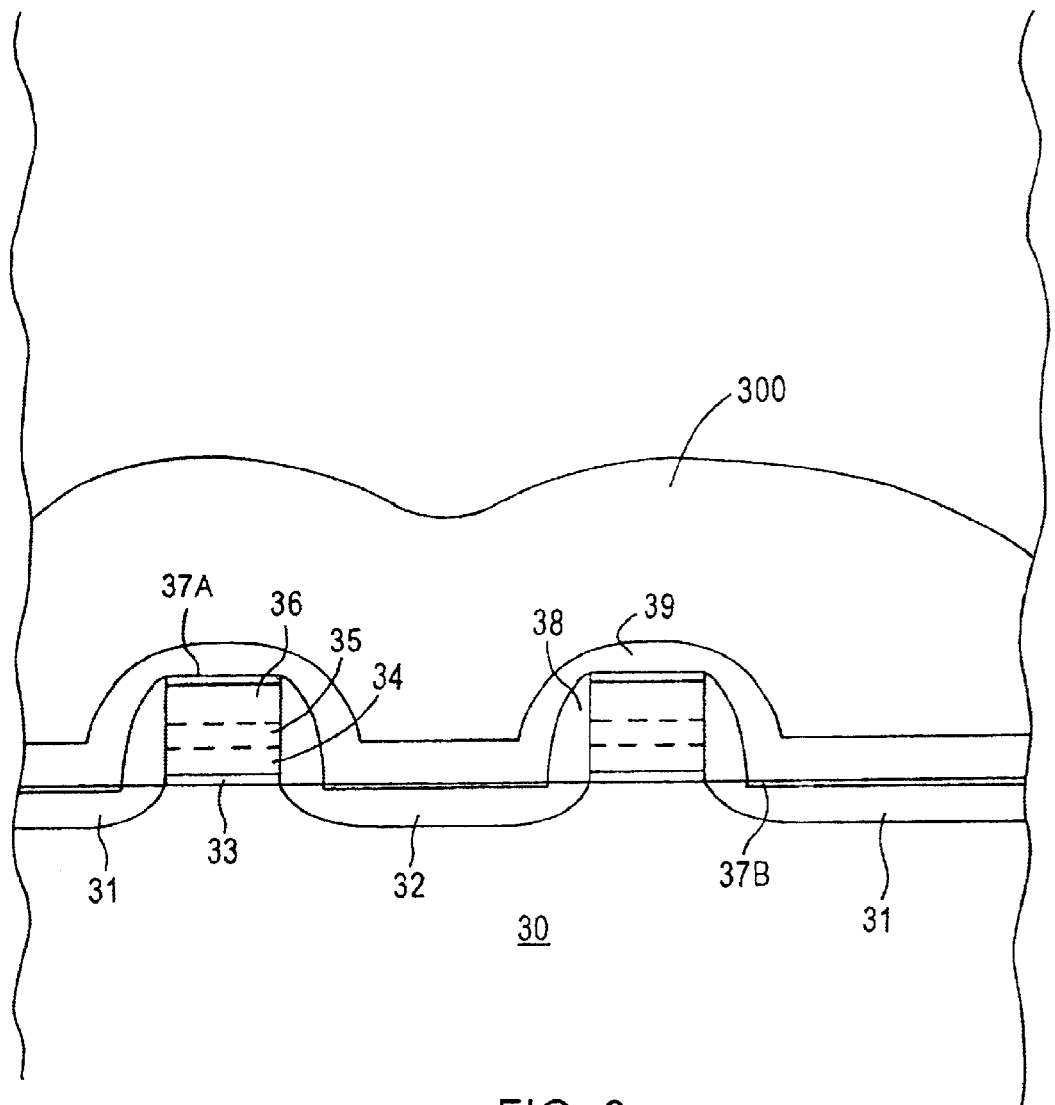
Figure 4:
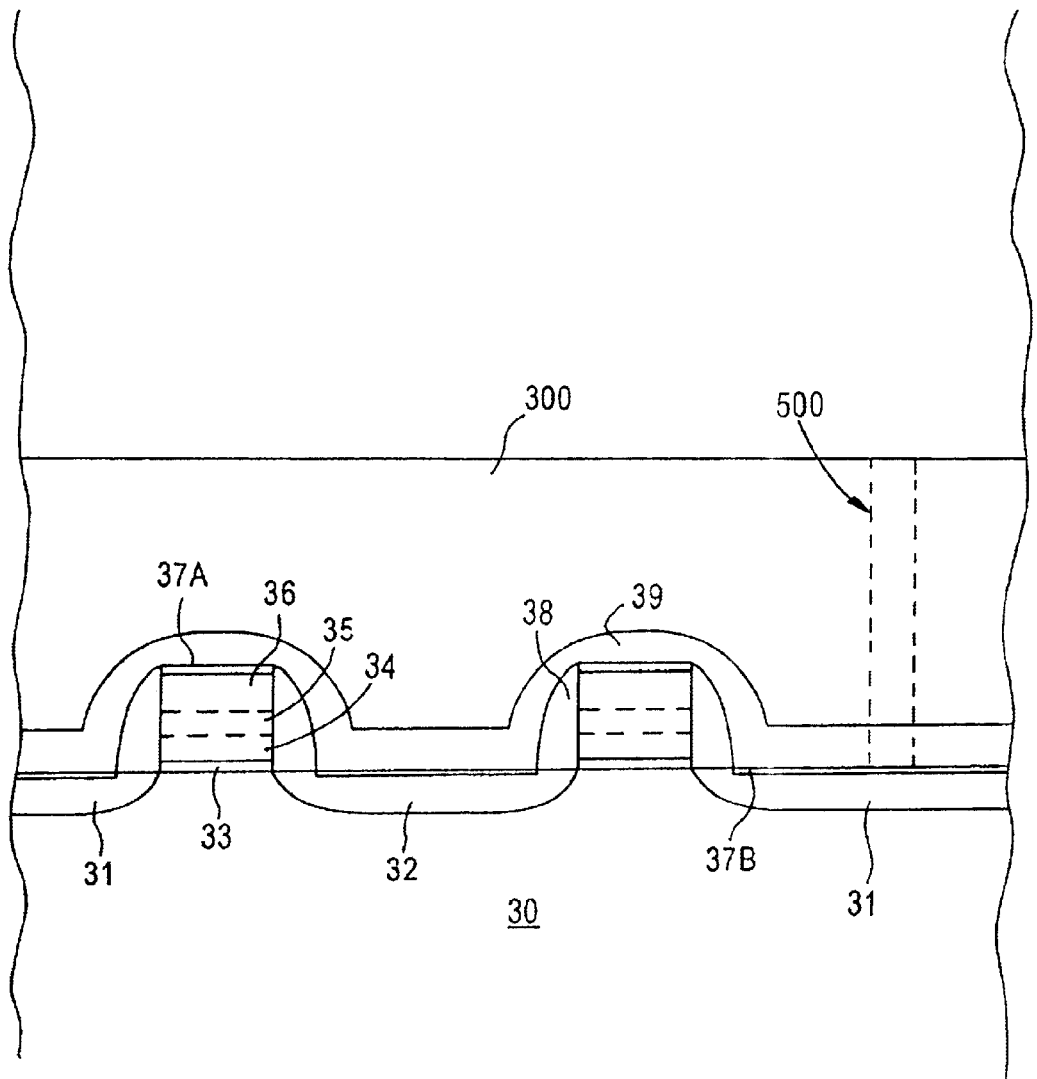

An embodiment of the present invention is schematically illustrated in FIGS. 2 through 4. As schematically shown in FIG. 2, processing is conducted in a conventional manner resulting in a structure substantially corresponding to that illustrated in FIG. 1, comprising substrate 30 with transistors thereon, such as MOS transistors and/or dual gate structures with an interpoly (ONO) dielectric therebetween. For example, the transistors can comprise tunnel oxide 33, a floating gate electrode 34, an ONO stack interpoly dielectric 35, and a control gate 36. A layer of metal silicide 37A is formed on an upper surface of the gate electrode stack while a layer of metal silicide 37B is formed on the source/drain regions 31, 32. A dielectric sidewall spacer 38, such as an oxide spacer, is formed on the side surfaces of the gate electrode and a conformal silicon nitride etch stop layer 39 deposited thereon.

$ILD_0$ 300 is then deposited, such as a BPSG layer, and thermal annealing conducted which results in voids 301 are formed between the gate stacks. In accordance with the present invention, however, laser thermal annealing is conducted, as schematically illustrated by arrows 400, by directing a pulsed laser light beam at the BPSG layer 300, particularly toward the gap between the transistors, causing reflowing of the BPSG layer 300, thereby eliminating the voids 300, as schematically illustrated in FIG. 3. Subsequent processing is conducted in a conventional manner as by planarizing BPSG layer 300 and forming contact openings 500, as shown in FIG. 4.

The present invention provides enabling methodology for fabricating semiconductor devices, particularly flash memory devices with a gate width of no greater than about 0.13 micron and under and gaps of about 0.33 micron or under, with significantly reduced $ILD_0$ voiding by implementing laser thermal annealing subsequent to formation of $ILD_0$. The present invention can also be employed to eliminate voids in oxide layers during various phases of semiconductor fabrication.

The present invention enjoys industrial applicability in manufacturing various types of semiconductor devices, particularly highly integrated semiconductor devices exhibiting increased circuit speed and sub-micron dimensions, e.g., with a design rule of about 0.12 micron and under, with high reliability. The present invention enjoys particular industrial applicability in manufacturing flash memory devices, such as EEPROMs.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

depositing an oxide layer over two neighboring gate electrode structures filling a gap therebetween, wherein the oxide layer contains a void in the gap; and laser thermal annealing the oxide layer by selectively directing a pulsed laser light beam targeted toward the gap to eliminate or substantially reduce the void by melting and reflowing the oxide layer.

2. The method according to claim 1, wherein the oxide layer is a boron-phosphorus-doped silicate glass (BPSG).

3. The method according to claim 2, comprising laser thermal annealing by directing the pulsed laser light beam at a radiant fluence of about 0.222 to about 0.228 joules/cm$^2$.

4. The method according to claim 3, comprising laser thermal annealing for about 10 to about 100 nanoseconds.

5. The method according to claim 3, comprising laser thermal annealing to elevate the temperature of the BPSG layer to about 780° C. to about 840° C.

6. The method according to claim 3, comprising laser thermal annealing in flowing nitrogen at a flow rate about 200 to about 2000 sccm.

7. The method according to claim 2, wherein the gate electrode structures have a gate width of about 0.18 micron or less.

8. The method according to claim 2, wherein each gate electrode structure comprises an oxide spacer layer on side surfaces of a gate stack and a conformal silicon nitride layer over the gate stack and oxide sidewall spacer.

9. The method according to claim 8, wherein neighboring gate electrode structures are separated by a gap of about 0.33 micron or less.

10. The method according to claim 1, wherein each gate electrode structure comprises a gate stack comprising:

a tunnel oxide on a semiconductor substrate;

a floating gate electrode on the tunnel oxide;

an interpoly dielectric on the floating gate;

a control gate electrode on the interpoly dielectric;

dielectric sidewall spacers on side surfaces of the gate electrodes; and an overlying etch stop layer.

11. The method according to claim 10, wherein the gap between neighboring gate stacks is about 0.33 micron or less.

12. The method according to claim 10, wherein the oxide layer is boron-phosphorus-doped silicate glass (BPSG).

13. The method according to claim 12, comprising laser thermal annealing by directing the pulsed laser light beam at a radiance fluence of about 0.222 to about 0.228 joules/cm$^2$.

14. The method according to claim 13, comprising laser thermal annealing for about-10 to about-100 nanoseconds.

15. The method according to claim 13, comprising laser thermal annealing to elevate the temperature of the BPSG layer to about 780° C. to about 840° C.

16. The method according to claim 13, comprising laser thermal annealing in flowing nitrogen at a flow rate about 200 to about 2000 sccm.

17. The method according to claim 1, comprising laser thermal annealing before forming any contact openings through the oxide layer.

18. The method according to claim 1, further comprising planarizing the oxide layer after laser thermal annealing.

* * * * *